United States Patent [19]

Beckner et al.

[11] Patent Number: 4,647,873
[45] Date of Patent: Mar. 3, 1987

[54] ADAPTIVE LINEAR FM SWEEP CORRECTIVE SYSTEM

[75] Inventors: Frederick L. Beckner, Palo Alto; Garry N. Hulderman, Riverside; Darrell K. Ingram, Menlo Park, all of Calif.

[73] Assignee: General Dynamics, Pomona Division, Pomona, Calif.

[21] Appl. No.: 757,031

[22] Filed: Jul. 19, 1985

[51] Int. Cl.$^4$ .................. H03B 23/00; H03L 7/06
[52] U.S. Cl. ............................................ 331/4; 331/14; 331/178
[58] Field of Search .......................... 331/4, 178, 14

[56] References Cited

U.S. PATENT DOCUMENTS

| | | | |
|---|---|---|---|
| 3,274,511 | 9/1966 | Dale et al. | 331/10 |
| 3,382,460 | 5/1968 | Blitz et al. | 331/178 |
| 3,568,085 | 3/1971 | Pimenoff | 331/14 |
| 3,576,498 | 4/1971 | Hirsch | 331/14 |
| 3,621,450 | 11/1971 | Blair et al. | 331/10 |
| 3,699,448 | 10/1972 | Martin et al. | 331/178 X |
| 4,063,182 | 12/1977 | Besson | 328/151 |
| 4,063,188 | 12/1977 | Mawhinney | 331/11 |
| 4,101,844 | 7/1978 | Malone | 331/10 |
| 4,130,808 | 12/1978 | Marzalek | 331/14 |
| 4,160,958 | 7/1979 | Mims et al. | 331/178 |
| 4,392,113 | 7/1978 | Jackson | 331/14 |
| 4,417,218 | 11/1983 | Berke | 331/178 |
| 4,499,435 | 2/1985 | Thomson et al. | 331/178 X |

Primary Examiner—Siegfried H. Grimm
Attorney, Agent, or Firm—Neil F. Martin; Russell B. Miller; Edward B. Johnson

[57] ABSTRACT

An apparatus and method for generating an output signal having portions thereof being linearly swept in frequency. A controller, responsive to external signals, generates a series of control signals. An oscillator, responsive to each one of the control signals, produces an output signal. The output signal includes a series of output waveforms each linearly swept in frequency and corresponding to a respective one of the control signals. A first servo, responsive to each one of the output waveforms, produces a series of first correction signals each dependent upon the linearity error in a corresponding one of the output waveforms. The first correction signals modify a corresponding control signal as applied to the oscillator so as to correct linearity errors occurring in a corresponding one of the output waveforms. A second servo, responsive to each one of the first correction signals, produces a series of second correction signals each dependent upon the correlations in the first correction signals. Each one of the second correction signals modify a following control signal in the series of control signals as applied to the oscillator so as to correct the correlated linearity errors occurring in each one of the output waveforms.

26 Claims, 10 Drawing Figures

ADAPTIVE LINEAR FM SWEEP CORRECTIVE SYSTEM

BACKGROUND OF THE INVENTION

I. Technical Field

This invention relates to linear frequency modulation (FM) sweep generator systems. More specifically, it relates to a linear FM sweep generator having a novel adaptive linearity correction system.

II. Background Art

Linear FM sweep generators produce an output signal in which the frequency of the output signal changes linearly as a function of time. In many applications of the linear FM sweep generator, it is necessary for the linearly swept output signal to be as precise and accurate as possible. However, due to nonlinearities inherent in the generator system and external factors such as temperature, humidity or age, the linearly-swept output signal may become nonlinear. The frequency nonlinearities in the output signal adversely affect the performance of the apparatus in which the linear FM sweep generator is used.

Linear FM sweep generators are generally utilized in test equipment applications where a linear FM sweep output is required, such as in a spectrum analyzer. Another application of the linear FM sweep generator is in radar systems. In particular, high-resolution radar systems may employ linear FM to achieve high levels of pulse compression. To realize the theoretical range resolution of these radar systems, especially with long correlation delays between the reference sweep and the received echos, a high degree of frequency sweep linearity is required. In addition, frequency sweep linearity is necessary to achieve low compressed pulse time sidelobe levels. The requirement of frequency sweep linearity applies both to high-resolution radar systems that (1) simultaneously transmit a reference sweep waveform while receiving an echo, and those which (2) reconstruct a reference sweep waveform beginning at the time of reception of echos from the range window of interest.

Open-loop pre-compensation is one technique used for compensating nonlinearities of a linear FM sweep generator having a voltage-controlled oscillator (VCO) driven by a control voltage waveform generator. This technique requires one to passively tailor the control voltage waveform to compensate for nonlinearities inherent in the VCO tuning characteristics, thereby improving the frequency sweep linearity of the output signal by reducing sweep-to-sweep correlated linearity errors.

To further improve a linear FM sweep generator, a closed-loop servo may be added. The closed-loop servo generally includes a frequency or phase detector, a sampling frequency generator, and a correction circuit so as to provide a servo error signal to the VCO. The closed-loop servo detects instantaneous frequency or phase deviations in the linear frequency sweep with respect to an ideal linear frequency sweep. The output signal of the VCO is sampled by the phase or frequency detector at a rate determined by the sampling frequency generator. The detected errors are used in a correction circuit to generate corresponding servo error signals. The servo error signals are applied to the input of the VCO along with the output of the control voltage waveform generator. The servo error signal provides the required linearity correction in the output signal.

Further improvements in the effectiveness of a closed-loop servo may be realized when it is combined with the open-loop pre-compensation technique. However, the open-loop pre-compensation in combination with a general closed-loop servo still suffers from sweep nonlinearities. With the open-loop pre-compensation technique, nonlinearity compensation is only as good as the initial matching of the control voltage waveform to the defined nonlinearity characteristics of the VCO. The defined nonlinearity characteristics of the VCO may change with age, temperature and/or various other causes thereby rendering the precompensation ineffective.

Generally, the closed-loop servo is designed to correct rapidly varying sweep linearity errors within the sweep. In addition to correcting the instantaneous sweep linearity errors within the sweep, the closed-loop servo during each sweep must also correct sweep linearity errors that are correlated from sweep-to-sweep. Correcting both correlated and uncorrelated errors places an onerous burden upon the closed-loop servo. The correlated errors may eventually exceed the dynamic range characteristics of the closed-loop servo resulting in a limitation of effective error correction.

It is therefore an object of the present invention to provide an adaptive linear FM sweep correction system that improves the sweep linearity of closed-loop linear FM sweep generators.

It is another object of the present invention to provide an adaptive closed-loop FM sweep generator by extracting additional information from the closed-loop servo error signal and utilizing the additional information to eliminate sweep-to-sweep correlated errors, thus improving the open-loop tuning accuracy of the VCO and the overall closed-loop sweep linearity.

It is yet another object of the present invention is to provide an improved highly-accurate linear FM sweep generator which automatically compensates for variations in the VCO frequency vs. voltage characteristics as a result of component mismatches; aging; fluctuations in power supply output voltages; or changes in environmental factors such as temperature, barometric pressure.

It is still another purpose of the present invention to provide an improved precision linear FM sweep generator which automatically compensates for sweep nonlinearities caused by frequency-dependent effects of components in the signal path between the VCO output and the sweep error measurement point, including effects due to inherent component defects, antenna reflections or component mismatches.

It is further purpose of the present invention to provide an adaptive linear FM sweep generator which generates accurate linear FM swept waveforms in a relatively simple and inexpensive manner by digital implementation of an active open-loop VCO tuning controller.

SUMMARY OF THE INVENTION

The present invention discloses the use of a servo error signal, developed in a servomechanism performing a repetitive cyclic function, to evolve a correction to the open-loop forcing function. This correction is such that after summing with the original estimated forcing function, no residual correlated error exists cycle-to-cycle. As such, a composite forcing function is evolved, whose accuracy is limited only by the basic servo error measurement accuracy and the quantization inherent in a digital arithmetic system. Therefore, the teachings of the present invention are applicable in those cases where repetitive closed-loop control of a variable is being performed. Examples of such cases would be in electronic and electromechanical scanning systems, electroacoustic or electro-optical function generators, and highly-accurate swept frequency waveform generators.

The present invention discloses a method and apparatus utilizing an adaptive linear FM sweep linearity correction technique. Using this technique, the accuracy of the open-loop tuning linearity of the control waveform generator/VCO is greatly enhanced. In the present invention, a closed-loop servo generates a servo error signal which is applied to the control voltage waveform to correct the instantaneous linearity error. The servo error signal is also used as an indicator of the open-loop tuning linearity error. An additional closed-loop servo is utilized to generate an adaptive correction signal based on the open-loop tuning linearity error in the servo error signal. The adaptive correction signal is summed with the control voltage waveform to correct the open-loop tuning linearity error. The adaptive correction signal corrects sweep-to-sweep correlated linearity errors. The servo error signal corrects residual instantaneous sweep linearity errors that are uncorrelated sweep-to-sweep. Implementation of the disclosed technique in a linear FM sweep system enables the system to achieve overall tuning accuracies better than 0.0001 percent.

The present invention discloses a method and apparatus for generating an output signal having portions thereof being linearly swept in frequency. The present invention includes control means responsive to external signals for generating a series of control signals and oscillator means responsive to each one of the control signals. The oscillator means produces an output signal frequency dependent upon the control signals. The output signal includes a series of output waveforms each linearly swept in frequency and corresponding to a respective one of the control signals. A first servo means, responsive to each one of the output waveforms, produces a series of first correction signals each dependent upon the linearity error in a corresponding one of the output waveforms. The first correction signals modify a corresponding control signal as applied to the oscillator means so as to correct linearity errors occurring in a corresponding one of the output waveforms. A second servo means, responsive to each one of the first correction signals, produces a series of second correction signals each dependent upon the correlations in the first correction signals. Each one of the second correction signals modifies a following one of the control signals as applied to the oscillator means so as to correct the correlated linearity errors occurring in each one of the output waveforms.

BRIEF DESCRIPTION OF THE DRAWINGS

These and other features, objects and advantages of the invention will be more fully apparent from a detailed description set forth below, taken in conjunction with the drawings in which like reference characters correspond throughout and wherein.

DETAILED DESCRIPTION OF THE PREFERRED EMBODIMENTS

Figure 1:
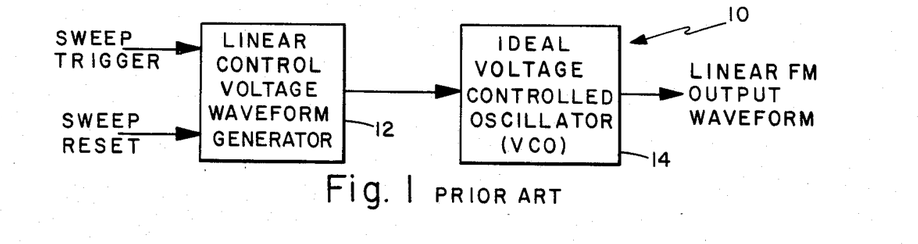
FIG. 1 is a block diagram of a prior art open-loop linear FM sweep generator using an ideal voltage controlled oscillator.

Referring to FIG. 1, there is shown in block diagram form a prior art open-loop linear FM sweep generator 10 using an ideal voltage controlled oscillator (VCO). In FIG. 1, a linear control voltage waveform generator 12, supplies a control voltage waveform to ideal voltage controlled oscillator (VCO) 14 so as to provide an output waveform from VCO 14. Since VCO 14 is an ideal VCO, control voltage waveform generator 12 need only supply a linear voltage ramp to ideal VCO 14. In response to the linear voltage ramp, VCO 14 provides a linear FM waveform output. Control voltage waveform generator 12 is supplied with control input signals, sweep trigger and sweep reset, to respectively initiate the linear voltage ramp and reset the control voltage waveform generator back to the original output voltage level.

Figure 2:
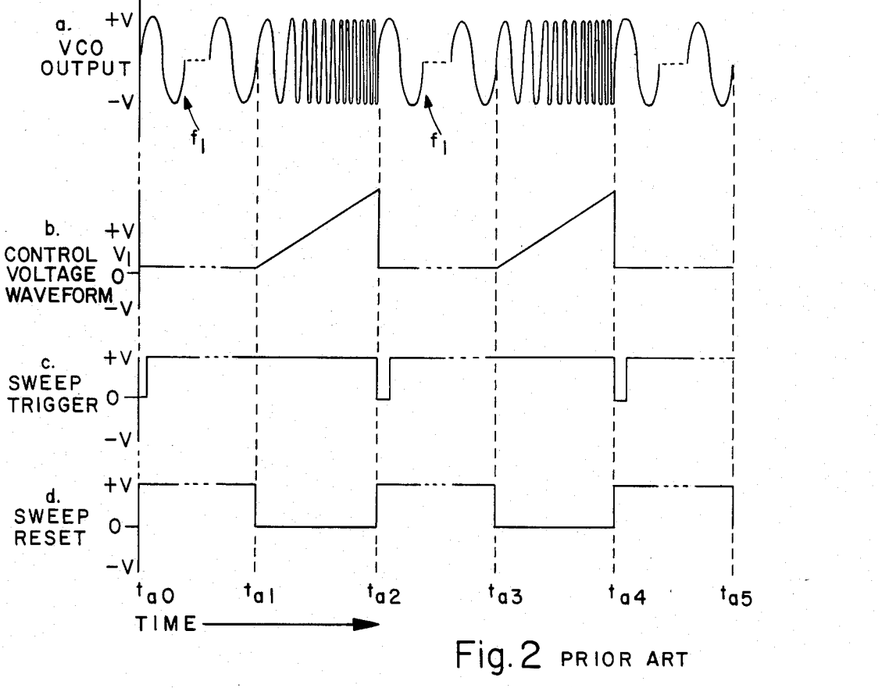
FIG. 2 is a series of graphical representations of output waveforms and control signals for the generator of FIG. 1.

FIG. 2 illustrates by graphical representation, the output waveforms and control signals for the open-loop linear FM sweep generator of FIG. 1. FIG. 2(a) illustrates over time an exemplary output voltage waveform from VCO 14. FIG. 2(b) illustrates over time a typical control voltage waveform output from control voltage waveform generator 12 and applied to VCO 14 so as to produce the VCO output shown in FIG. 2(a). FIGS. 2(c) and 2(d), respectively illustrate over time, the sweep trigger and sweep reset signals applied to control voltage waveform generator 12.

In FIGS. 2(a)–2(d), during the time period $t_{a0}$–$t_{a1}$, control voltage waveform generator 12 provides a fixed output voltage $V_1$. The voltage $V_1$ is applied to ideal VCO 14 which outputs a voltage waveform having a fixed frequency, $f_1$, corresponding to the input voltage $V_1$. Also during the time period $t_{a0}$–$t_{a1}$, the sweep trigger and sweep reset signals are held at a "high" voltage.

At time $t_{a1}$, the sweep reset signal goes "low" thus enabling the control voltage waveform generator 12 to output a linear voltage ramp. As the output voltage from the control voltage waveform generator 12 linearly increases during the time period $t_{a1}$–$t_{a2}$, the VCO output voltage correspondingly undergoes a linear increase in frequency.

At time $t_{a2}$, the sweep trigger signal goes "low" and the sweep reset signal returns to the original "high". The "low" sweep trigger signal applied to control voltage waveform generator 12 ends the linear voltage ramp and the output voltage returns to the original pre-established output voltage $V_1$. The returning of the control voltage waveform generator output voltage to the level $V_1$, forces the VCO output frequency to return to the original fixed frequency $f_1$.

During the time period $t_{a2}$–$t_{a3}$, the sweep reset signal remains "high". Subsequent to the time $t_{a2}$ and during the time period $t_{a2}$–$t_{a3}$, the sweep trigger signal returns to the "high" state. With the sweep reset signal in the "high" state, control voltage waveform generator 12 is inhibited from outputting a linear voltage ramp. Hence, control voltage waveform generator 12 outputs the voltage $V_1$ which forces the VCO to remain at the original fixed frequency $f_1$.

At time $t_{a3}$, the sweep reset signal goes to the "low" state thereby enabling control voltage waveform generator 12 to output a linearly increasing voltage waveform, i.e., linear voltage ramp. During the time period $t_{a3}$–$t_{a4}$, the VCO output increases linearly in frequency. Therefore, the events of the time period $t_{a1}$–$t_{a2}$ are repeated during the time period $t_{a3}$–$t_{a4}$. Similarly, the events of the time period $t_{a2}$–$t_{a3}$ are repeated during the time period $t_{a4}$–$t_{a5}$. During the time period $t_{a4}$–$t_{a5}$, the VCO output is at the fixed frequency $f_1$.

In effect, time periods $t_{a0}$–$t_{a1}$, $t_{a2}$–$t_{a3}$ and $t_{a4}$–$t_5$ are defined as the fixed reference frequency periods. Time periods $t_{a1}$–$t_{a2}$ and $t_{a3}$–$t_{a4}$ are defined as the linear frequency sweep periods.

In practice, the frequency vs. voltage characteristics of a VCO are not perfectly linear. To obtain a linear frequency sweep output from a VCO during the sweep period, some means of correcting for the nonlinear characteristics of the VCO must be employed. One such means is to vary the control voltage waveform during the sweep so as to compensate for the defined nonlinear characteristics of the VCO.

Figure 3:
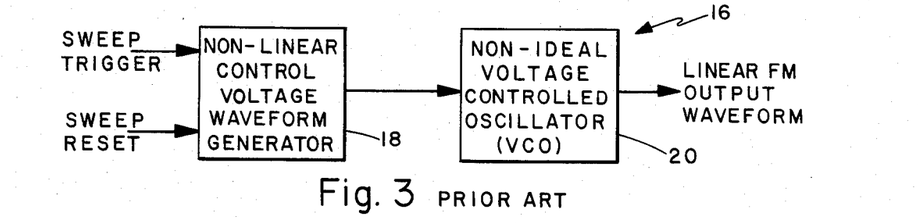
FIG. 3 is a block diagram of a prior art open-loop precompensated linear FM sweep generator using a non-ideal voltage controlled oscillator.

FIG. 3 illustrates in block diagram form one such implementation of the just-described technique. In FIG. 3 there is shown a prior art open-loop pre-compensated linear FM sweep generator 16. Sweep generator 16 consists of a control voltage waveform generator 18 having inputs for sweep trigger and sweep reset signals and an output coupled to drive non-ideal VCO 20. Control voltage waveform generator 18 has been matched to compensate for the measured nonlinearities of VCO 20. Therefore, control voltage waveform generator 18 provides an output voltage which forces a linear FM sweep output from VCO 20.

The open-loop pre-compensation technique is limited by the degree to which the waveform generator can be matched to the VCO tuning nonlinearities. Another disadvantage to the open-loop pre-compensation technique is that the achievable sweep linearity is degraded by changes in the VCO tuning characteristics. These changes may be caused by environmental factors such as temperature and aging.

To overcome the limitations of the open-loop approach, closed-loop servos are used to implement highly-accurate linear FM sweep generators. The closed-loop servos are used to measure and correct the instantaneous deviation of the frequency sweep from the ideal linear frequency sweep. The closed-loop servo develops a servo error signal which corrects the control voltage waveform, thereby improving the linearity of any linear swept frequency.

Figure 4:
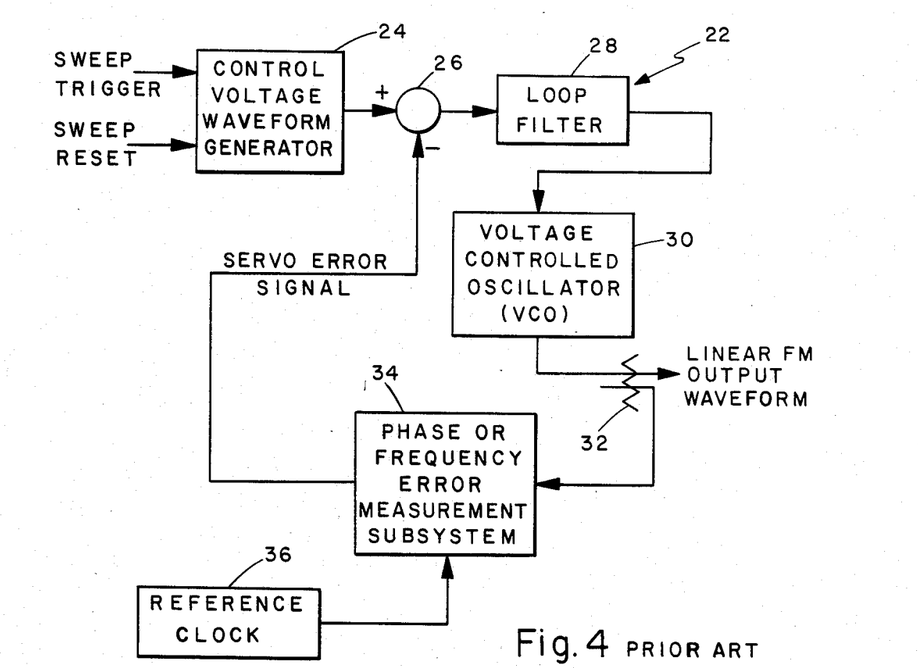
FIG. 4 is a block diagram of a prior art closed-loop linear FM sweep generator.

FIG. 4 illustrates in block diagram form, a prior art closed-loop linear FM sweep generator 22. Sweep generator 22 includes control voltage waveform generator 24, having sweep trigger and sweep reset signal inputs. The output of control voltage waveform generator 24 is coupled to an input of summing point 26. The output of summing point 26 is coupled to loop filter 38 which filters the VCO control voltage. The output of loop filter 28 is applied to VCO 30 which produces an output frequency corresponding to the voltage applied to the input of VCO 30.

A small portion of the output of VCO 30 is fed through coupler 32 into error measurement subsystem 34. Error measurement subsystem 34 utilizes a clock input from reference clock 36 to maintain accurate control timing in the error measurement. Error measurement subsystem 34 produces a servo error signal which is output therefrom and coupled into an input of summing point 26. At summing point 26, the servo error signal and the output from control voltage waveform generator 24 are summed to provide a corrected control voltage waveform to the input of VCO 30 via loop filter 28. Error measurement subsystem 34 may produce a servo error signal based upon the phase or frequency error in the VCO output signal. Whether error measurement subsystem 34 is a phase or frequency error detection system is dependent upon the designer's choice. Error measurement subsystem 34 assists in maintaining a stable fixed reference frequency during a fixed frequency period. This is accomplished by phase locked loop techniques well known in the art. More importantly, error measurement subsystem 34 also provides the linear swept frequency error correction during the linear frequency sweep.

Figure 5:
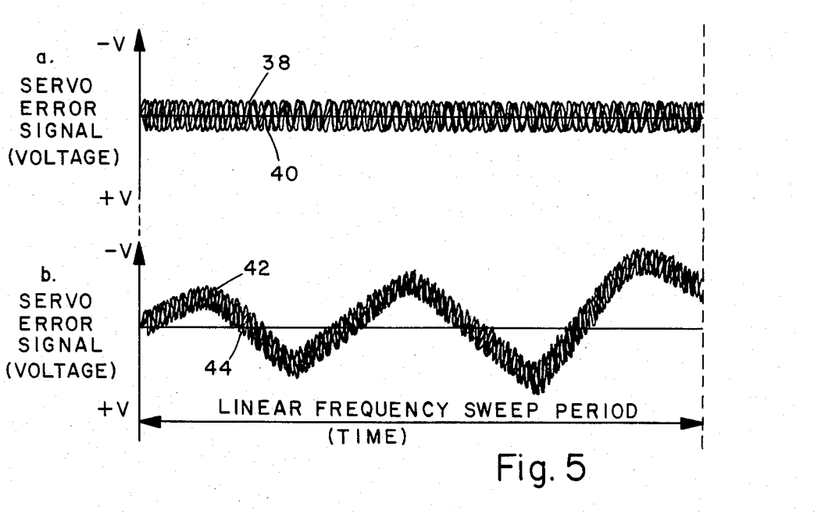
FIG. 5 is a series of graphical representations of error signals produced by the generator of FIG. 4.

FIG. 5 illustrates by graphical representation servo error signals that are produced by the closed-loop linear FM sweep generator of FIG. 4 during successive linear frequency sweep. In an ideal closed-loop system, where there is no sweep-to-sweep repeatable measurement errors over the frequency sweep, sweep linearity would be limited by measurement noise in the servo error signal across the sweep. Hence, the servo error signal displayed for many sweeps would appear to be noiselike. The repetitive voltage vs. time display of the servo error signals across the linear frequency sweep period is indicative of the performance of the closed-loop linear FM sweep generator. FIG. 5(a) illustrates two exemplary servo error signals 38 and 40 from an ideal closed loop linear FM sweep generator occurring during two linear frequency sweeps.

In an actual closed-loop linear FM sweep generator, there are two components of the total measured error that must be corrected by the servo error signal. The first component of the total error is that being corrected by the ideal closed loop system, i.e. the instantaneous error. The second component of the total error is that portion which can be correlated over many sweeps, i.e., the repetitive sweep-to-sweep error. Each sweep, the error measurement subsystem must measure and correct for both the instantaneous error and the sweep correlated error. As a result, the error measurement subsystem is burdened with measuring and correcting the repeated sweep correlated error.

FIG. 5(b) illustrates servo error signals 42 and 44 taken over two linear frequency sweeps. Servo error signals 42 and 44 exhibit both the idealized noise-like servo error signal (instantaneous error correction) and a repeatable low frequency component (repetitive sweep-to-sweep correlated error correction).

One method of improving the linearity of a closed-loop linear FM frequency generator is to increase the loop gain of the linearizing servo. However, sweep linearity improvement using this approach is limited. The servo loop gain cannot be set to any arbitrary value. The dynamic characteristics of the loop, i.e., the damping or transient response, depend on both the servo loop gain and the bandwith of the loop. Increases in the loop gain without a corresponding increase in the loop bandwidth may result in instability of the loop. In order to increase the servo loop gain and maintain proper damping, the loop bandwidth must also be increased. However, in all closed-loop linear FM sweep generators there are practical restrictions on the achievable increase in loop bandwidth. These restrictions are related to the particular error measurement subsystem employed and to loop stability constraints. Consequently, there is a limit to the useful servo loop gain and the ability of the loop to improve the linearity beyond the open-loop value.

Another method used to improve the linearity of a closed-loop linear FM sweep generator is to improve the open-loop tuning linearity of the control voltage waveform generator/VCO. Such a modification would permit the closed-loop servo to operate on a higher linearity open-loop sweep thereby achieving a higher overall linearity. Using conventional techniques such diode linearizers; exponential and analog computer sweep generators; and stored-reference digital waveform generators, dramatic improvements and overall FM sweep linearity are simply not possible. This is a result of the difficulty of exactly matching the open-loop control voltage waveform generator output voltage to the tuning characteristics of the VCO. Furthermore, a system utilizing a critically-matched fixed control waveform becomes increasingly sensitive to changes to the VCO tuning characteristics as the open-linearity is improved.

Figure 6:
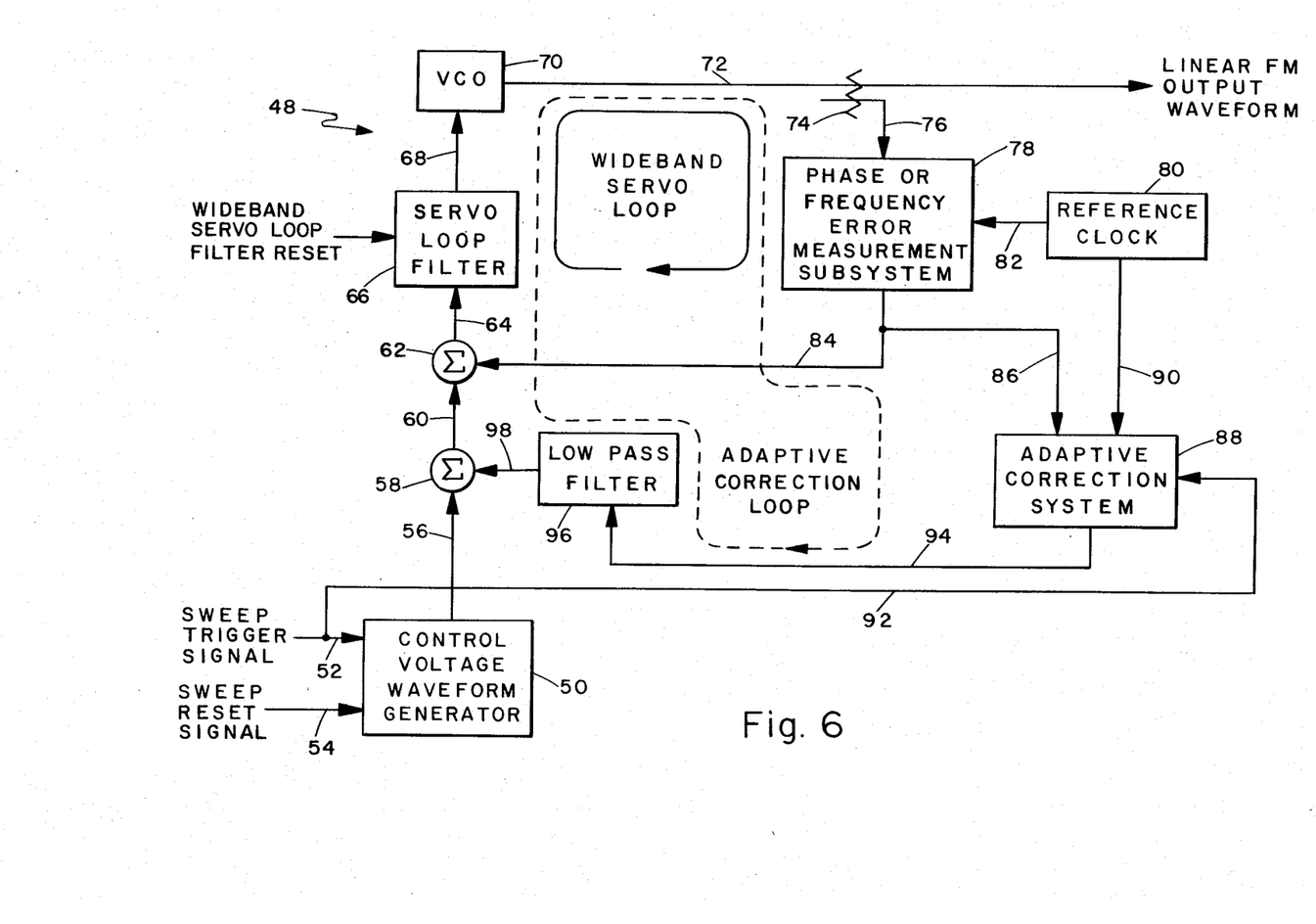
FIG. 6 is a block diagram of a closed-loop linear FM sweep generator utilizing the adaptive correction system of the present invention.

Referring to FIG. 6, there is shown in block diagram form the adaptive linear FM sweep generator of the present invention. In FIG. 6, a linear FM sweep generator 48 is illustrated which incorporates a wideband servo loop and an adaptive correction loop to respectively correct in-sweep linearity errors and sweep-to-sweep correlated linearity errors.

In FIG. 6, there is shown a control voltage waveform generator 50 adapted to receive sweep trigger and sweep reset signals respectively on lines 52 and 54. Control voltage waveform generator 50 provides as its output an open-loop tuning voltage on line 56 to summing point 58. Summing point 58 sums the open-loop tuning voltage with an adaptive correction signal, generated within the adaptive correction loop to provide an output of a corrected open-loop tuning voltage.

The corrected open-loop tuning voltage is coupled on line 60 to summing point 62 where it is summed with the servo error signals generated within the wideband servo loop. The summed output from summing point 62 is coupled on line 64 to servo loop filter 66. The filtered output from servo loop filter 66 is a VCO tuning voltage that is coupled on line 68 to VCO 70.

VCO 70 produces an output waveform on line 72 in response to the input VCO tuning control voltage. A portion of the output waveform is coupled from line 72 by coupler 74 to line 76 into error measurement subsystem 78. Error measurement subsystem 78 samples the VCO output waveform with sample timing being provided by reference clock 80. Clock pulses from clock 80 are provided to error measurement subsystem 78 on line 82.

Error measurement subsystem 78 generates a servo error signal as a result of the linearity error in the sampled VCO output waveform. The servo error signal is coupled on line 84 to summing point 62.

The servo error signal is also coupled on line 86 to adaptive correction system 88. Adaptive correction system 88 is provided with timing signals from reference clock 80 on line 90. Adaptive correction system 88 is also provided with the sweep trigger signal on line 92. Adaptive correction system 88 provides an adaptive correction signal on line 94 to low pass filter 96. Low pass filter 96 removes high frequency noise from the adaptive correction signal. The filtered adaptive correction signal is then coupled by line 98 to summing point 58. At summing point 58, the filtered adaptive correction is summed with the open-loop tuning voltage, thereby resulting in the corrected open-loop tuning voltage.

In the preferred embodiment, control voltage waveform generator 50 is implemented as a polynomial sweep generator that permits selectable control of the open-loop tuning voltage. Summing point 58 and 60 are operational amplifier summing circuits. Servo loop filter 66 is preferably a second order passive RC filter. Error measurement subsystem 78 may be constructed to measure the phase or frequency error in the VCO output waveform. Such error measurement subsystems are well known in the art. Coupler 74 may be implemented as a waveguide directional coupler when used in systems where the VCO output is coupled to a waveguide for transmission.

The adaptive correction system in the present invention provides an adaptive correction signal implemented as a time series of adaptive correction signal samples spanning the duration of the linear FM sweep portion of the output waveform. Conceptually, each of the adaptive correction signal samples may be thought of as the output of a separate sampled data integrator operating on an input error sample obtained from the same location within each sweep. Each adaptive correction signal sample depends upon the average of the error measurement obtained from many successive sweeps. The implementation of the present invention as illustrated in FIG. 6 results in the bandwidth of the adaptive correction loop being narrow when compared with the bandwidth of the wideband servo loop. The narrow bandwidth of the adaptive correction loop thereby provides significant noise rejection in the adaptive correction loop. However, the bandwidth of the adaptive correction loop is sufficiently large to accurately follow the thermally-induced drift of the VCO tuning characteristics so as to automatically compensate for such effects.

Figure 7:
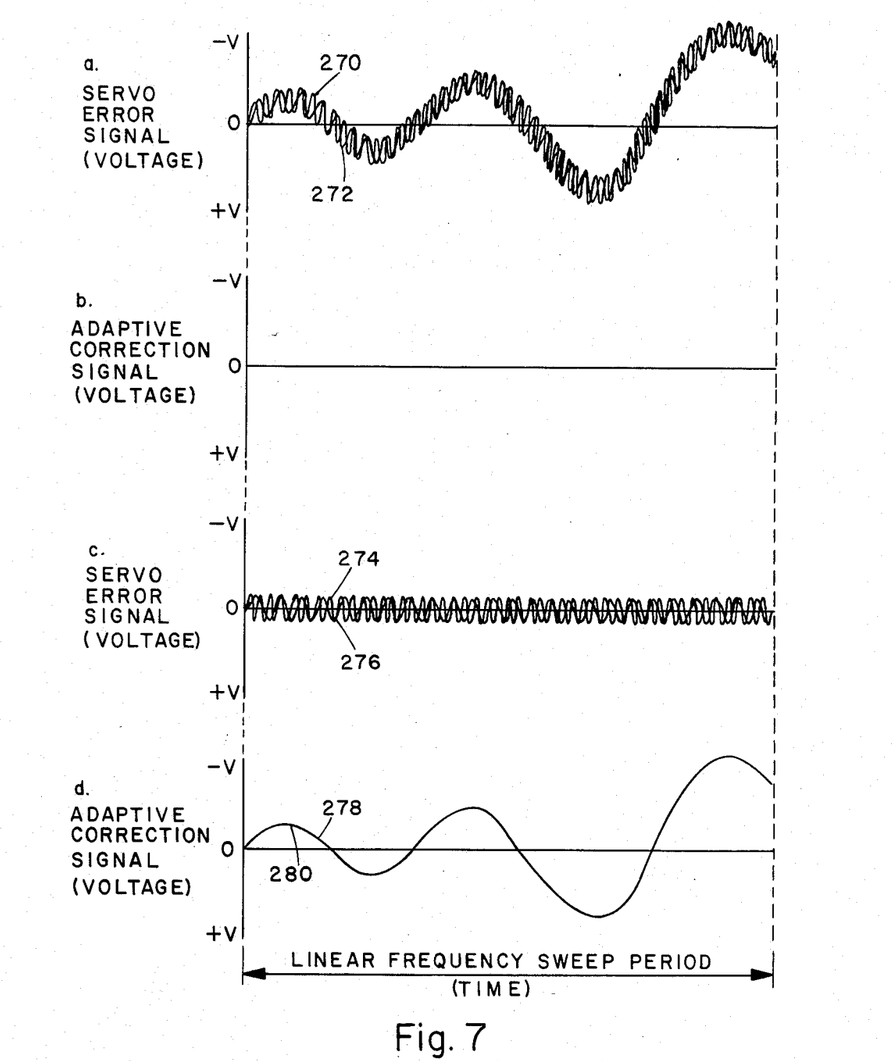
FIG. 7 is a series of graphical representations of error signals produced by the generator of FIG. 6.

Referring to FIG. 7, correction signals for the wideband servo loop and adaptive correction loop are illustrated for two exemplary linear frequency sweeps. In FIG. 7(a), with the adaptive correction system disabled, servo error signals 270 and 272 are measured over two different linear frequency sweep periods and are superimposed on each other for illustrative purposes. Both servo error signals 270 and 272 contain a high frequency noise-like component and a low frequency component.

The high frequency component is indicative of the servo error signal applied to correct the in-sweep instantaneous linearity in the output waveform. With the adaptive correction loop disabled, no adaptive correction signal is supplied from the adaptive correction loop as is illustrated in FIG. 7(b).

When the adaptive correction loop is enabled, the resulting servo error signals have the correlated sweep-to-sweep linearity error removed therefrom as is illustrated in FIG. 7(c). In FIG. 7(c), servo error signals 274 and 276 are taken over different linear frequency sweeps and are superimposed on each other for illustrative purposes. Servo error signals 274 and 276 are illustrated as containing only the high frequency noise-like component with no low frequency component therein.

FIG. 7(d) illustrates the adaptive correction signal 278, corresponding to servo error signal 274 taken over the same linear frequency sweep while adaptive correction signal 280 corresponds to servo error signal 276. Adaptive correction signals 278 and 280 are illustrated as being identical which corresponds to no change in the sweep-to-sweep correlated error during the two linear frequency sweeps.

Figure 8:
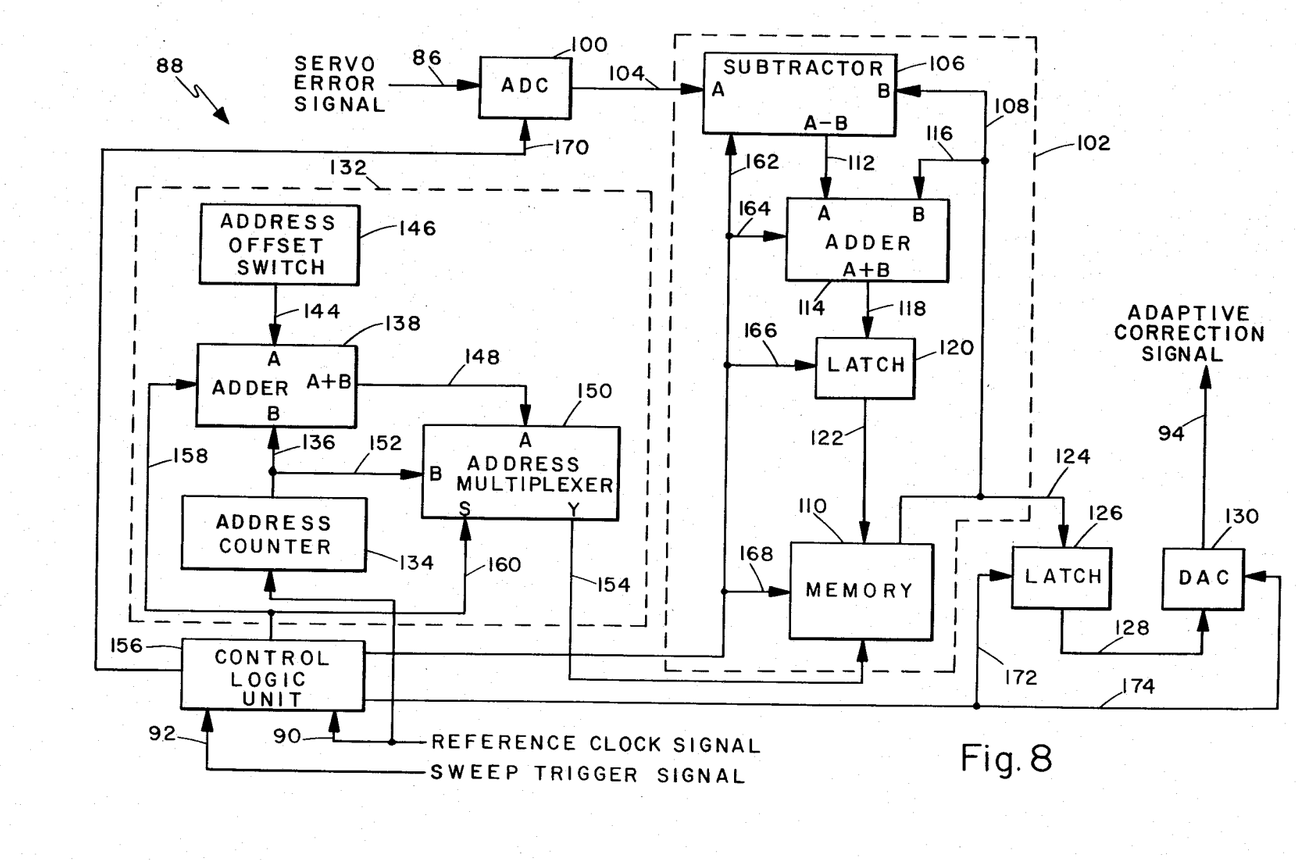
FIG. 8 is a block diagram of the adaptive correction system of the present invention.

In the preferred embodiment of the invention, the adaptive correction system is implemented by application of digital signal processing techniques. Referring to FIG. 8, there is shown in block diagram form the adaptive correction loop of the present invention implemented with digital signal processing techniques.

Referring to FIGS. 6 and 8, the servo error signal from error measurement subsystem 78 is coupled by line 86 to adaptive correction system 88. In adaptive correction system 88, line 86 is coupled to the input of analog to digital converter (ADC) 100. ADC 100 samples the analog servo error signal during the linear frequency sweep period and converts the sample into digital form.

A servo error signal sample digitized in ADC 100 is output to a "fading memory" or exponential filter 102. A digitized sample is output from ADC 100 on line 104 to the A input of subtractor 106. A portion of an adaptive correction signal sample is input to the B input of subtractor 106 on line 108 from memory 110. This adaptive correction signal sample output from memory 110 corresponds to the same point in the linear frequency sweep period as the digitized sample presented to the A input of subtractor 106. Subtractor 108 provides at an A−B output a differential signal sample representing the difference between the two input signal samples.

The differential signal sample output from the A−B output of subtractor 106 is coupled by line 112 to the A input of adder 114. The full adaptive correction signal from memory 110 is applied to the B input of adder 114 on line 116. Adder 114 provides at an A+B output an updated adaptive correction signal sample representative of the addition of the differential signal sample and the full adaptive correction signal sample.

The updated adaptive correction signal sample is output from adder 112 on line 118 to latch 120 where the signal is temporarily held. The updated adaptive correction signal sample is output from latch 120 on line 122 to memory 110. The updated adaptive correction signal sample is stored at a memory location within memory 110. The memory location at which the updated correction signal sample is stored in memory 110 is the same one from which the adaptive correction signal sample was taken to compute the updated sample. In operation, it can be seen that subtractor 106, adder 114 and memory 110 cooperate to perform the "fading memory" function.

The updated adaptive correction signal sample is later output during the next linear frequency sweep period to correct the sweep-to-sweep correlated linearity error occurring at the same sampling point location in the sweep. The updated adaptive correction signal sample is output from memory 110 on line 124 to latch 126. Latch 126 temporarily holds the data for output on line 128 to digital to analog converter (DAC) 130. DAC 130 converts the updated adaptive correction signal sample from digital to analog form. The analog updated correction signal is coupled on line 94 out of DAC 130 and the adaptive correction system 88 to low pass filter 96.

A next servo error signal sample taken from the servo error signal during the same linear frequency sweep is processed in an identical fashion in ADC 100 and exponential filter 102 as was the proceeding servo error signal sample. To respectively provide proper retrieval and storage of the next adaptive correction signal sample and its update in memory 110, memory addressing means 132 is included in adaptive correction system 88.

Memory addressing means 132 comprises an address counter 134, adder 138, address offset switch 146, and address multiplexer 150. Address counter 134 provides a digital signal, i.e., address location value, representative of an address location in memory 110. Address counter 134 is responsive to a counter control signal, i.e. the reference clock signal, to sequentially step through the digital values representative of the address locations in memory 110.

Line 136 couples the address signal from address counter 134 to the B input of adder 138. Coupled to the A input of adder 138, by line 144, is the output of address offset switch 146. Address offset switch 146 is constructed to permit selectable control of the value of an output digital signal, i.e., offset signal. The offset signal from address offset switch 146 enables memory address adjustment when added with the output of address counter 134 in adder 138.

Adder 138 adds the address signal and the offset signal to produce an offset address signal. The offset address signal is output from the A+B output of adder 138 on line 148 to the A input of address multiplexer 150.

Address multiplexer 150 receives at the B input on line 152, the output of address counter 134. At the Y output of address multiplexer 150 the offset address signal or the address signal is coupled by line 154 to the address input of memory 110. The signal presented on line 154 determines the memory location within memory 110 that is addressed. Memory addressing means 132 operates under the control of control logic unit 156.

Control logic unit 156 receives reference clock signals from reference clock 80 on line 90. Control logic unit 156 also receives the sweep trigger signal on line 92. Control logic unit 156 provides a control signal on line 158 to initiate addition of the signals input at the A and B inputs in adder 138. Control logic unit 156 also provides a CORRECTION OUT/SAMPLE IN signal on line 160 to address multiplexer 150 to select between the offset address signal or the address signal for outputting to memory 110.

Control logic unit 156 provides control signals to exponential filter 102 to process digitized servo error signal samples. Control signals are provided on lines 162 and 164 to respectively initiate subtraction of the signals appearing at the A and B inputs of subtractor 106 and addition of the signals appearing at the A and B inputs of adder 114. Control signals from control logic unit 156 are provided to latch 120 on line 166 to control the holding of data in the latch 120. Control logic unit 156 provides on line 168 a MEMORY READ/WRITE signal to memory 110 which enables memory 110 to either output stored data or write data into a selected memory location.

Control logic unit 156 provides a control signal on line 170 to initiate sampling and digitizing of the servo error signal. Control logic unit 156 provides a control signal on line 172 to control the holding of the adaptive correction signal sample in latch 126. In addition, control logic unit 156 provides a control signal on line 174 to initiate the digital to analog conversion of the adaptive correction signal sample and outputting of the analog sample from DAC 130 to low pass filter 96.

In the preferred embodiment of the invention, ADC 100 is an 8-bit 2's complement analog to digital converter having a conversion time less than the time between servo error signal samples. Subtractor 106 is a 9-bit subtractor. Subtractor 106 receives at the A input the 8-bit digitized servo error signal sample along with a 1-bit extended sign bit from ADC 100.

Memory 110 is preferably a random access memory having a 1024 word by 16-bit storage capacity. Each 16 bit word is selectively output from memory 110 on lines 108, 116 and 124. On line 108, only the eight most significant bits of a selected word plus an extended sign bit of the selected word are input at the B input of subtractor 106. The A−B output of subtractor 106 outputs a 9-bit word along with seven extended sign bits to the A input of adder 114. On line 116 the full sixteen bits of the same word applied to subtractor 106 is also applied to the B input of adder 114, adder 114 being a 16-bit adder. Adder 114 adds the two input words and provides at the A+B output a 16-bit word output to latch 120, which is typically a 16-bit latch. The 16-bit word output from latch 120 represents an updated adaptive correction signal sample. This updated adaptive correction signal sample is then written into the same memory location in memory 110 from which the 16-bit word was read from and processed in subtractor 106 and adder 114.

Address offset switch 146 is typically a variable digital switch which is preset to give a selected 4-bit digital word that is output on line 144 to the A input of adder 134. Address counter 138 is typically a 10-bit address counter that provides a 10-bit word on line 136 to the B input of adder 138. Adder 138 is typically a 10-bit adder for adding the word from address offset switch 146 with the 10-bit word from address counter 134. Address multiplexer 150 is a digital address multiplexer which supplies a selected 10-bit output word to the address input of memory 110. Under the control of control logic unit 156, address multiplexer 150 selectively outputs the 10-bit address from address counter 134 or the 10-bit offset address from adder 138.

Latch 126 is a 10-bit digital latch which receives the ten most significant bits of a 16-bit adaptive correction signal sample word from a selected memory location within memory 110. The ten most significant bits of the adaptive correction signal sample are output from latch 126 on line 128 to DAC 130, DAC 130 being a 10-bit digital to analog converter. The adaptive correction signal sample output on line 94 from DAC 130 is an analog adaptive correction signal sample which is then coupled to low pass filter 96. Low pass filter 96 filters high frequency digital noise from the adaptive correction signal sample. The filtered analog adaptive correction signal sample is then summed at summing point 66 with the control voltage waveform so as to modify the open-loop tuning voltage.

In operation, the adaptive correction system continuously samples the servo error signal throughout a linear frequency sweep. Each of the servo error signal samples are processed and stored in individual memory locations within memory 110. The data stored in memory 110 is output sequentially and summed with the control voltage waveform during the next linear frequency sweep so as to correct sweep-to-sweep correlated linearity errors occurring in the VCO output waveform. In effect, the adaptive correction system serves to operate as a bank of parallel narrowband servo loops that automatically generate a correction signal required to drive a time-averaged or correlated servo error signal to zero at each sampling point across the sweep.

Closed-loop linear FM sweep generators are susceptible to signal processing delays in the servo loops. In the linear FM sweep generator of the present invention, signal delays are also present in the servo loops. In the embodiment illustrated in FIG. 6, signal processing delays are encountered in error measurement subsystem 78, servo loop filter 66, and low pass filter 96. To compensate for servo delays and ensure stable operation of the adaptive correction loop, an adaptive correction signal sample resulting from the linearity error at a designated point within the linear frequency sweep must be output from memory 110 in advance of sampling the servo error signal sample occurring at the same designated point within a present linear frequency sweep. The servo error signal sample is therefore a result of the applied adaptive correction signal sample which affects the linear frequency sweep at the designated point. This advance outputting technique ensures the matching of a stimulus output and response input for each individual sampling point within the linear frequency sweep. Therefore, the mean servo error signal, as processed in the exponential filter and stored in a memory location, is independently driven to zero under the influence of the adaptive correction signal sample previously output from the same memory location.

Figure 9:
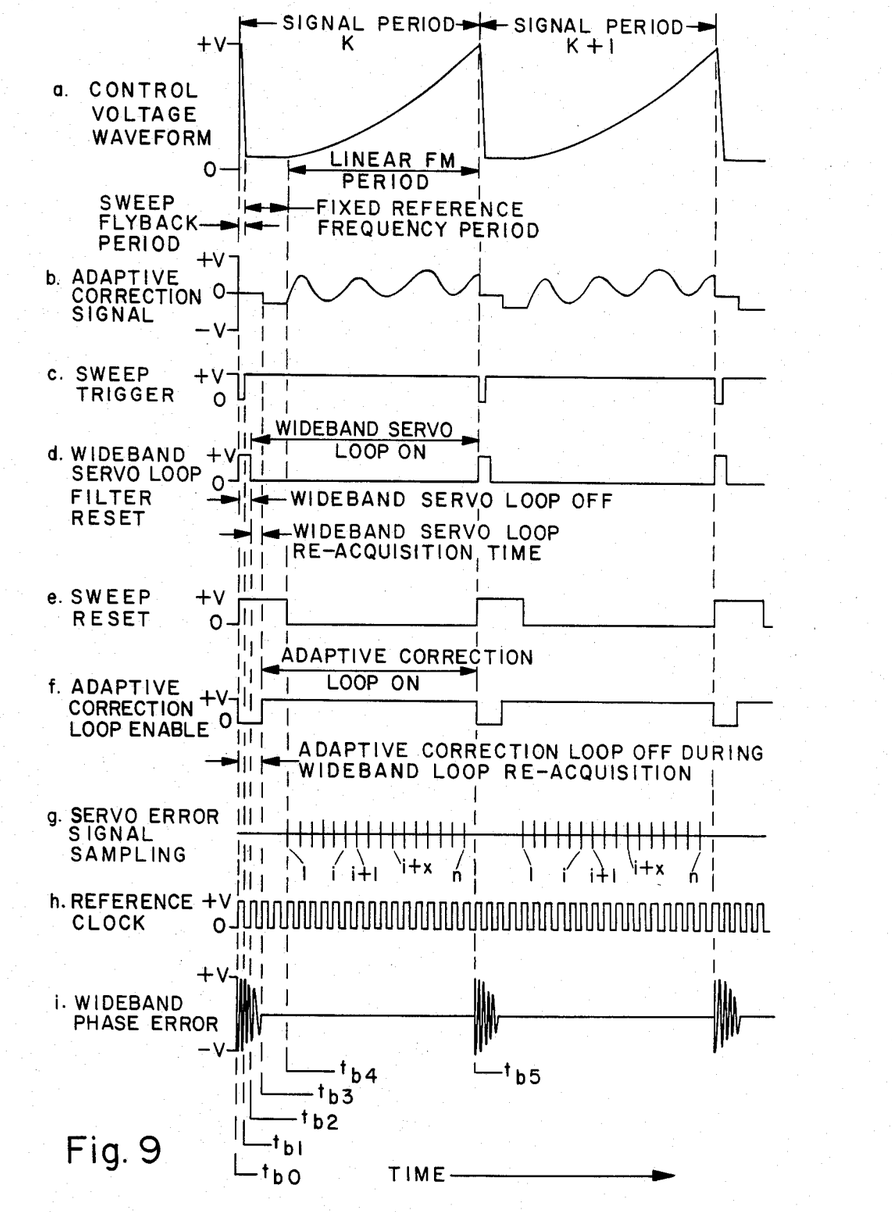
FIG. 9 is a series of graphical representations of control signal for the closed-loop linear FM sweep generator utilizing the adaptive correction system of the present invention.

FIGS. 9(a)-9(i) are graphical representations of the control signals for the closed-loop linear FM sweep generator utilizing the adaptive correction system of the present invention. FIG. 9(a) illustrates the control voltage waveform as output from the control voltage waveform generator through two signal periods, K and K+1. Each signal period is comprised of three separate segmented periods, i.e. the sweep flyback period ($t_{b0}-t_{b1}$), the fixed reference frequency period ($t_{b1}-t_{b4}$) and the linear FM sweep period ($t_{b4}-t_{b5}$). FIG. 9(b) illustrates the corresponding adaptive correction signal used to modify the control voltage waveform. FIG. 9(c) illustrates the timing sequence of the sweep trigger signal which is used to reset the control voltage waveform to a pre-established level and begin another signal period. FIG. 9(d) illustrates the wideband servo loop reset signal which enables or disables operation of the wideband servo loop. FIG. 9(e) illustrates the sweep reset signal which is used to inhibit the control voltage waveform generator from generating a substantially linear output waveform. FIG. 9(f) illustrates the adaptive correction loop enable signal which controls the activation of the adaptive correction loop. FIG. 9(g)

illustrates sample timing of the servo error signal. FIG. 9(h) illustrates the reference clock timing pulses from the reference clock. FIG. 9(i) illustrates the wideband phase error measured at the output of the VCO.

In referring to FIGS. 9(a)–9(i), at a time $t_{b0}$, the control voltage waveform, which was previously increasing, is now driven to a pre-established voltage level by the falling edge of the sweep trigger pulse. In addition, the wideband servo loop filter reset signal generated by the control logic unit, and applied to the servo loop filter reset input goes "high", thus disabling the wideband servo loop during the sweep flyback. During the sweep flyback period the VCO output frequency returns from a high frequency signal to the pre-established reference frequency. Also at time $t_{b0}$, the sweep reset signal goes "high", thus inhibiting the control waveform generator from outputting a voltage higher than the pre-established level. In addition, at time $t_{b0}$ the adaptive correction loop enable signal generated by the control logic unit and applied to the adaptive loop subsystem falls, thus forcing the adaptive correction signal to zero. The timing of each of these control signals is provided by the reference clock pulses. Prior to the time, $t_{b0}$, the wideband phase error is zero as a result of the wideband loop and the adaptive correction loop being enabled and thus preventing a phase error in the VCO output. However, during the sweep flyback period, $t_{b0}$–$t_{b1}$, the wideband phase error is uncontrolled as a result of the control voltage waveform radically decreasing to the pre-established voltage level.

At time $t_{b1}$, the control voltage waveform has reached the pre-established voltage level and is disabled from increasing by the "high" status of sweep reset signal. In addition, the sweep trigger signal returns to the "high" status at time $t_{b1}$.

At time $t_{b2}$, the wide band servo loop filter reset signal falls, thus activating the wideband servo loop. During the time period $t_{b2}$–$t_{b3}$, the wideband servo loop begins to reacquire the VCO output signal and establishes phase lock loop control to the fixed reference frequency.

At time $t_{b3}$, the adaptive correction loop is activated by the rising of the adaptive correction loop enable signal. Upon activation of the adaptive correction loop, the servo error signal is sampled and an adaptive correction signal is generated corresponding to the correlated linearity error occurring in the fixed referenced frequency of the VCO output. Since there is a fixed reference frequency output from the VCO the adaptive correction signal is generally a constant voltage.

During the time period $t_{b3}$–$t_{b4}$, the wideband phase error in the fixed reference frequency VCO output signal has been substantially corrected by the servo error signal and the adaptive correction signal.

At time $t_{b4}$, the sweep reset signal falls thereby enabling the control voltage waveform generator to undergo a pre-determined increase in output voltage. During the linear frequency sweep period, $t_{b4}$–$t_{b5}$, the control voltage increases thereby directing a linear FM sweep in the VCO output signal. Linearity errors in the VCO output signal are corrected by the servo error signal and the adaptive correction signal.

At time $t_{b5}$, a new signal period (k+1) begins with the falling sweep trigger signal. In general, the operation of the adaptive correction system is initiated by the adaptive correction loop enable signal generated by the control logic unit.

Control logic unit 156 provides control signals to ADC 100 which samples the servo error signal N times during each signal period with the $i^{th}$ servo error signal sample occurring at the same location in each signal. For exemplary purposes herein two signal periods K and K+1 of the M signal periods are described. In the signal period K at the $i^{th}$ signal location, the servo error signal sample $S_K(i)$ is processed in exponential filter 102 with the resultant adaptive correction signal sample $A_K(i)$ being stored in the $i^{th}$ memory location in memory 110. During the next signal period, K+1 at the $i^{th}$ signal location, the servo error signal sample $S_{K+1}(i)$ is processed by exponential filter 102 with the resultant adaptive correction signal sample $A_{K+1}(i)$ being an update of the $A_K(i)$ sample that is stored in the $i^{th}$ memory location in memory 110.

The $A_K(i)$ adaptive correction signal sample is stored in the $i^{th}$ memory location of memory 110 during the K signal. During the following signal period, K+1, the $A_K(i)$ adaptive correction signal sample is output from the $i^{th}$ memory location for processing of the $S_{K+1}(i)$ servo error signal sample. A fraction of the $A_K(i)$ adaptive correction signal sample is applied to the B input of subtractor 106 while the $S_{K+1}(i)$ servo error signal sample is applied to the A input of subtractor 106. Subtractor 106 provides an output to adder 114 representative of the difference between the fractional portion of the $A_K(i)$ adaptive correction signal sample and the $S_{K+1}(i)$ servo error signal sample. This differential signal is added in adder 114 with the full $A_K(i)$ adaptive correction signal sample. The output of adder 114 is an updated adaptive correction signal sample $A_{K+1}(i)$ which is then written into the $i^{th}$ memory location of memory 110.

The updated adaptive correction signal sample $A_{K+1}(i)$ stored in the $i^{th}$ memory location is defined by the following equation:

$$A_{K+1}(i) = S_{K+1}(i) + (1-\alpha)A_K(i) \quad (1)$$

where $S_{K+1}(i)$ is the $i^{th}$ servo error signal sample in the K+1 signal period, $\alpha$ is the fraction of the $A_K(i)$ sample subtracted from the $A_{K+1}(i)$ sample, and $A_K(i)$ is the current output of the $i^{th}$ memory location. Equation (1) is valid for each of the N sample points in the M signal periods.

In the digital implementation of the preferred embodiment, $\alpha = 1/256$. From equation (1), the input sample processing for each memory location forms a simple digital exponential filter. The "fading memory" characteristic inherent in an exponential filter is necessary to achieve stable system operation due to the inherent finite word length arithmetic and discrete step delay available using the digital approach.

As previously discussed, for stable operation of the adaptive correction system, advance outputting of the adaptive correction signal sample is required. The advanced outputting of an adaptive correction signal sample, in affect, compensates for loop delays. The advance outputting of the adaptive correction signal sample requires cooperation between memory addressing means 132 and memory 110 under the control of control logic unit 156. In memory addressing means 132, address offset switch 146 is preset to generate an offset value, x. The offset value x is selected such that the offset value multiplied by the time between servo error signal sample is approximately equal to the delay through servo loop filter 66, error measurement subsystem 78 and low pass filter 96. Address counter 134 generates a current address counter value i. The x value and the i value are added in adder 138 to give the offset address signal that addresses that offset address memory location (i+x) in memory 110. At the appropriate time in the K+1 signal period, the $S_{K+1}(i)$ servo error signal sample is processed by exponential filter 102 for storage in the $i^{th}$ memory location of memory 110 as the updated adaptive correction signal sample $A_{K+1}(i)$. However, prior to the storage of the $A_{K+1}(i)$ sample it is temporarily held in latch 120. While the $A_{K+1}(i)$ sample is held in latch 120, control logic unit 156 directs address multiplexer 150 to address the offset address memory location (i+x) of memory 110. The adaptive correction signal sample stored in the (i+x) memory location, i.e. the $A_K(i+x)$, is read out of memory 110 and loaded into latch 126. After the $A_K(i+x)$ sample is loaded into latch 126, control logic unit 156 directs address multiplexer 150 to address the $i^{th}$ memory location in memory 110. With the $i^{th}$ memory location being addressed the $A_{K+1}(i)$ sample is output from latch 120 and stored in the $i^{th}$ memory location in memory 110. The $A_K(i+x)$ sample is output from latch 126 to DAC 130 where it is converted into analog form. The analog $A_K(i+x)$ sample is output to low pass filter 96 and then summed with the open-loop tuning voltage at summing point 58.

For example, should the loop delays be equal to two sample cycles, address offset switch 146 would be set to output a digital value corresponding to the 2, i.e. x=2. Therefore, during cycle i of the K signal period, the adaptive correction signal cycle, $A_{K-1}(i+2)$ contained within the (i+2) memory location is output to low pass filter 96 through latch 126 and DAC 130.

Next, the adaptive correction signal sample $A_{K-1}(i)$ is read from the current memory address location, (i), from which a fractional portion thereof is applied to subtractor 106 while the full signal sample is applied to adder 114. The servo error signal sample $S_K(i)$ is also applied to subtractor 106. Exponential filter 102 then computes the updated adaptive correction signal sample $A_K(i)$.

The servo error signal sample S is the result of the adaptive correction signal sample $A_{K-1}(i)$ that was output from the $i^{th}$ memory location during the (i−2) cycle to compensate for the loop delays. The $A_{K-1}(i)$ adaptive correction signal sample affects the output of VCO 70 during the $i^{th}$ cycle.

To complete the signal processing for the (i) sample cycle, the computed updated adaptive correction signal sample $A_K(i)$ is stored in the $i^{th}$ memory location.

Figure 10:
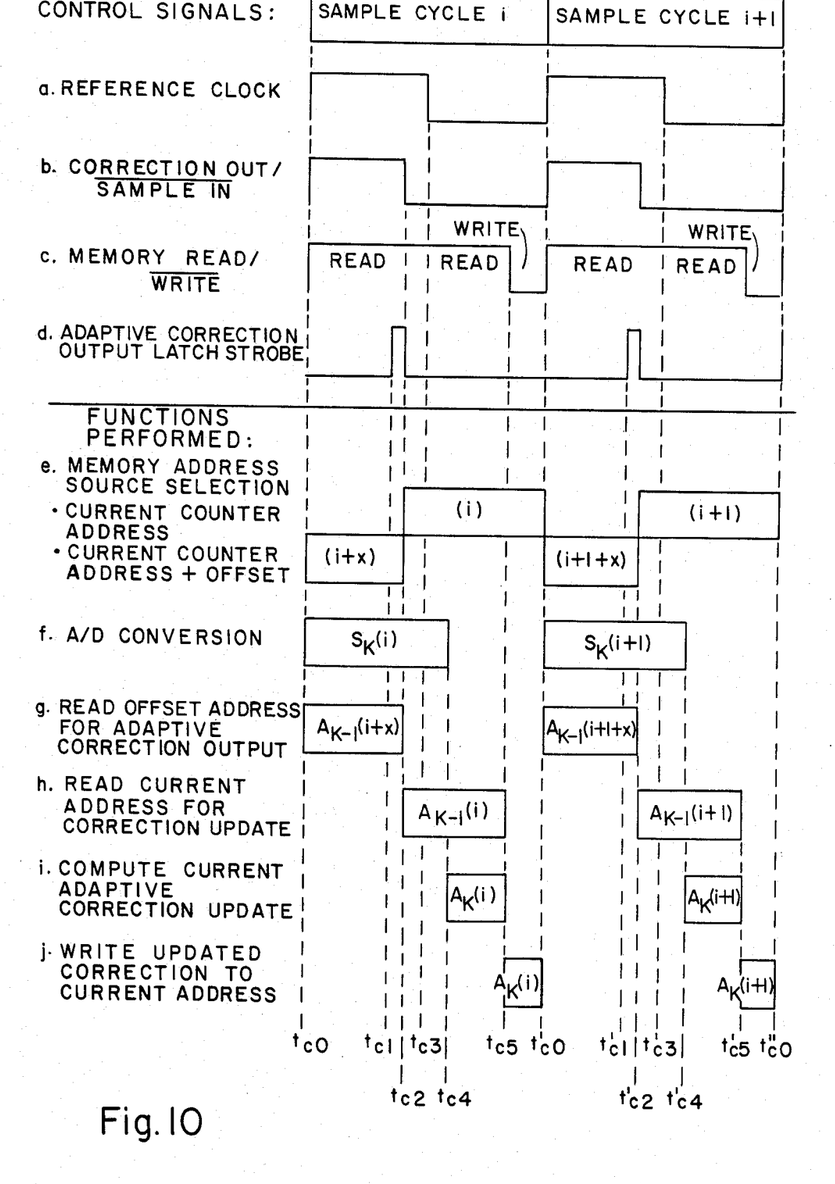
FIG. 10 is a series of graphical representations of the timing and control functions performed by the adaptive correction system during a linear frequency sweep period.

Referring to FIG. 10, there is shown a timing diagram for selective control signals and functions in the updating of the $i^{th}$ and (i+1) memory locations. Sample timing is controlled by control signals from control logic unit 156 in response to clock pulses from reference clock 80. At time $t_{c0}$, the $i^{th}$ sample cycle begins with the reference clock signal going "high". Also at time $t_{c0}$ the CORRECTION OUT/SAMPLE IN and the MEMORY READ/WRITE signals go "high". The "high" CORRECTION OUT/SAMPLE IN forces address multiplexer 150 to apply to memory 110 the address location output from adder 134, which is the current address counter plus offset address, i.e, (i+x). The MEMORY READ/WRITE being "high" forces memory 110 to read out the adaptive correction signal sample $A_{K-1}(i+x)$ stored in the (i+x) memory location. Therefore, the $A_{K-1}(i+x)$ adaptive correction signal sample is output to the adaptive correction output latch 126. At time $t_{c1}$, latch 126 is provided with a latch strobe signal to output the sample held therein to DAC 130.

At time $t_{c2}$, the CORRECTION OUT/SAMPLE IN signal goes "low" thus forcing address multiplexer 150 to apply the current counter address, i, from address counter 134 to memory 110. Since the MEMORY READ/WRITE signal remains "high", memory 110 reads out the adaptive correction signal sample stored in the $i^{th}$ memory location. Memory 110 outputs the $A_{K-1}(i)$ adaptive correction signal sample, generated during the K−1 signal period, from the $i^{th}$ memory location. The $A_{K-1}(i)$ adaptive correction signal sample is applied to subtractor 106 and adder 114 of exponential filter 102 during the time period $t_{c2}-t_{c5}$. The digitizing of the $S_K(i)$ servo error signal sample occurs during the time period $t_{c0}-t_{c4}$ and is applied to subtractor 106 at time $t_{c4}$.

At time $t_{c4}$, the $A_{K-1}(i)$ adaptive correction signal sample is updated by computing an updated adaptive correction signal $A_K(i)$. The computation is completed at time $t_{c5}$.

At time $t_{c5}$, the MEMORY READ/WRITE signal goes "low", therefore writing the updated adaptive correction signal sample $A_K(i)$ into the $i^{th}$ memory location addressed during the period $t_{c5}-t'_{c0}$.

At time $t'_{c0}$ the referenced clock signal again goes "high" from the "low" state it had been in since time $t_{c3}$. Also at time $t'_{c0}$ the CORRECTION OUT/SAMPLE IN and the MEMORY READ/WRITE signals go "high". The rising of the reference clock signal at time $t'_{c0}$ initiates a (i+1) sample cycle.

The reference clock pulse at time $t'_{c0}$, through control logic unit 156 increments the output of address counter 134 by a least significant bit. The "high" CORRECTION OUT/SAMPLE IN signal forces address multiplexer 150 to output to memory 110 the current incremented counter address plus offset address, (i+1+x). Addressing of the (i+1+x) memory location and the "high" MEMORY READ/WRITE signal forces the outputting of the $A_{K-1}(i+1+x)$ adaptive correction signal sample. The $A_{K-1}(i+1+x)$ adaptive correction signal sample is output to the adaptive correction output latch, latch 126. At time $t'_{c1}$, latch 126 is provided with a latch strobe signal to output the sample held therein to DAC 130.

At time $t'_{c2}$, the CORRECTION OUT/SAMPLE IN signal goes "low" thus forcing address multiplexer 150 to apply the current counter address, (i+1) from address counter 134 to memory 110. Since the MEMORY READ/WRITE signal remains "high", the $A_{K-1}(i+1)$ adaptive correction signal sample is read out of the (i+1) memory location. Memory 110 outputs the $A_{K-1}(i+1)$ adaptive correction signal sample to subtractor 106 and adder 114 during the time period $t'_{c2}-t'_{c5}$. The digitizing of the $S_K(i+1)$ servo error signal sample occurs during the time period $t'_{c0}-t'_{c4}$ and is applied to subtractor 106 at time $t'_{c4}$.

At time $t'_{c4}$, the $A_{K-1}(i+1)$ adaptive correction signal sample is updated by computing an updated adaptive correction signal sample $A_K(i+1)$. The computation of the updated adaptive correction signal sample is completed at $t'_{c5}$.

At time $t'_{c5}$, the MEMORY READ/WRITE signal goes "low", therefore writing into the (i+1) memory location the adaptive correction signal sample $A_K(i+1)$, the (i+1) memory location being addressed during the $t'_{c2}-t'_{c0}$ time period. At time $t'_{c0}$, the sequence is repeated for the (i+2) sample cycle.

In application, the present invention may be utilized in a linear FM radar system to correct for sources of error in addition to those directly related to the VCO and associated control circuitry. As long as the additional sources of error are within the signal path between the linear FM sweep generator output and the error measurement point, the invention will correct for these errors. For example, the effects of phase description due to a traveling wave tube (TWT) amplifier can be removed. This is accomplished by locating the RF sweep sampling point i.e., error measurement point, after the TWT thereby placing these affects within the servo and adaptive correction loops.

The concept as described in the present invention may be extended by using a single random access memory having multiple blocks of memory locations therein. The additional blocks of memory would be used for storing compensation data for different sets of cyclic operating conditions. This is especially appropriate where the linear FM sweep is caused to start at different initial frequencies thus requiring different correction functions. Another applicable situation for the multiple blocks of memory locations would be in an electromechanical scanning system where the mechanical dynamics are different depending upon the direction of scan.

In an alternate embodiment, a plurality of random access memories would be used to supply the additional memory blocks. A memory select means would be implemented to select the particular block of memory that correction signals would be read from and written into. A memory select means such as a semiconductor chip select signal would be used to control the selection of the memory blocks.

In another embodiment of the invention, a non-volatile memory is used for storing the adaptive correction signal. Use of the non-volatile memory ensures that the initial open-loop tuning upon system turn-on would be that used at the time the system was last turned off.

The previous description of the preferred embodiments are provided to enable any persons skilled in the art to make or use the present invention. Various modifications to these embodiments will be readily apparent to those skilled in the art, and the generic principles defined herein may be applied to other embodiments without the use of the inventive faculty. Thus, the present invention is not intended to be limited to the embodiment shown herein, but is to be accorded the widest scope consistent with the principles and novel features disclosed herein.

What is claimed is:

1. An apparatus for generating an output signal having portions thereof being linearly swept in frequency comprising:
    control means for generating a series of control signals;
    oscillator means responsive to each one of said control signals for producing an output signal, frequency dependent upon said control signals, said output signal including a series of output waveforms each linearly swept in frequency and corresponding to a respective one of said control signals;
    first servo means responsive to each one of said output waveforms in said output signal for producing a series of first correction signals each dependent upon the linearity error in a corresponding one of said output waveforms, each one of said first correction signals modifying a corresponding one of said control signals as applied to said oscillator means so as to correct linearity errors occurring in a corresponding one of said output waveforms; and
    second servo means responsive to each one of said first correction signals for producing a series of second correction signals each depending upon the correlations in said first correction signals, each one of said second correction signals modifying a following control signal in said series of control signals applied to said oscillator means so as to correct the correlated linearity errors occurring in each one of said output waveforms.

2. The apparatus of claim 1 wherein said control means comprises a control voltage waveform generator of the polynomial sweep generator type and said oscillator means comprises a voltage controlled oscillator.

3. The apparatus of claim 2 wherein said first servo means comprises:
    frequency error measurement means for detecting the frequency error in each one of said output waveforms and producing a corresponding one of said first correction signals;
    means for coupling a fraction of said output signal to said frequency error measurement means; and
    first summing means for summing of each one of said first correction signals with a corresponding one of said control signals, the output of said first summing means being applied to the input of said voltage controlled oscillator.

4. The apparatus of claim 2 wherein said first servo means comprises:
    phase error measurement means for detecting the phase error in each one of said output waveforms and producing a corresponding one of said first correction signals;
    means for coupling a fraction of said output signal to said phase error measurement means; and
    first summing means for summing each one of said first correction signals with a corresponding one of said control signals, the output of said first summing means being applied to the input of said voltage controlled oscillator.

5. The apparatus of claim 3 wherein said second servo means comprises:
    fading memory means for detecting the correlations in said first correction signals and producing a corresponding one of said second correction signals;
    means for coupling a fraction of each one of said first correction signals to said fading memory means; and
    second summing means for summing each one of said second correction signals with a following control signal in said series of control signals, the output of said second summing means being applied to said first summing means for summing with a following first correction signal in said series of first correction signals, the output of said first summing means being applied to the input of said voltage controlled oscillator.

6. The apparatus of claim 4 wherein said second servo means comprises:
    fading memory means for detecting the correlations in said first correction signals and producing a corresponding one of said second correction signals;

means for coupling a fraction of each one of said first correction signals to said fading memory means; and second summing means for summing each one of said second correction signals with a following control signal in said series of control signals, the output of said second summing means being applied to said first summing means for summing with a following first correction signal in said series of first correction signals, the output of said first summing means being applied to the input of said voltage controlled oscillator.

7. An adaptive linear FM sweep generator comprising:

control voltage waveform generating means for generating an open-loop tuning voltage;

first summing means coupled to said control voltage waveforms generating means for summing said open-loop tuning voltage with an adaptive correction signal to produce a corrected open-loop tuning voltage;

second summing means coupled to said first summing means for summing said corrected open-loop tuning voltage with a servo error signal to produce an oscillator tuning control voltage;

oscillator means coupled to said second summing means and responsive to said oscillator tuning control voltage so as to produce an output signal, frequency dependent upon said oscillator tuning control voltage;

error measurement means coupled to said oscillator means and said second summing means, said error measurement means responsive to said output signal and reference timing signals to as to detect linearity errors in said output signal and provide to said second summing means said servo error signal, said servo error signal being dependent upon said linearity errors;

adaptive correction means coupled to said error measurement means and said first summing means, said adaptive correction means responsive to said servo error signal and said reference timing signal so as to provide to said first summing means adaptive correction signal, said adaptive correction signal being dependent upon correlated errors in said servo error signal for correcting correlated errors in said output signal; and clock means coupled to said error measurement means and said adaptive correction means for providing said reference timing signals to said error measurement means and said adaptive correction means.

8. The adaptive linear FM sweep generator of claim 7 wherein said control voltage waveform generating means is a polynomial sweep generator and said oscillator means is a voltage controlled oscillator.

9. The adaptive linear FM sweep generator of claim 8 wherein said error measurement means comprises a frequency error measurement subsystem for detecting the frequency errors in said output signal and providing said servo error signal dependent upon said detected frequency errors.

10. The adaptive linear FM sweep generator of claim 9 wherein said adaptive correction means comprises:

first converting means for sampling said servo error signal and converting each servo error signal sample from analog to digital form;

exponential filter means coupled to said first converting means for computing an adaptive correction signal sample corresponding to a respective servo error signal sample, the collection of said adaptive correction signal samples forming said adaptive correction signal;

second converting means coupled to said exponential filter means for converting each adaptive correction signal sample from digital to analog form and providing the adaptive correction signal to said first summing means; and control logic means coupled to said first and second converting means and said exponential filter means and responsive to said reference timing signals for initiating the sampling and conversion of said servo error signal in said first converting means, for initiating the conversion and outputting of said adaptive correction signal in said second conversion means, and for controlling the computation of each adaptive correction signal sample in said exponential filter means.

11. The adaptive linear FM sweep generator of claim 10 further comprising:

first filter means coupled between said second summing means and said oscillator means for filtering said oscillator tuning control voltage; and second filter means coupled between said adpative correction means and said first summing means for filtering said adaptive correction signal.

12. The adaptive linear FM sweep generator of claim 8 wherein said error measurement means comprises a phase error measurement subsystem for detecting the phase errors in said output signal and providing said servo error signal dependent upon said detected phase errors.

13. The adaptive linear FM sweep generator of claim 12 wherein said adaptive correction means comprises:

first converting means for sampling said servo error signal and converting each servo error signal sample from analog to digital form;

exponential filter means coupled to said first converting means for computing an adaptive correction signal sample corresponding to a respective servo error signal sample, the collection of said adaptive correction signal samples forming said adaptive correction signal;

second converting means coupled to said exponential filter means for converting each adaptive correction signal sample from digital to analog form and providing the adaptive correction signal to said first summing means; and control logic means coupled to said first and second converting means and said exponential filter means and responsive to said reference timing signals for initiating the sampling and conversion of said servo error signal in said first converting means, for initiating the conversion and outputting of said adaptive correction signal in said second conversion means, and for controlling the computation of each adaptive correction signal sample in said exponential filter means.

14. The adaptive linear FM sweep generator of claim 13 further comprising:

first filter means coupled between said second summing means and said oscillator means for filtering said oscillator tuning control voltage; and second filter means coupled between said adaptive correction means and said first summing means for filtering said adaptive correction signal.

15. An adaptive linear FM sweep generator comprising:
   a. a control voltage waveform generator
   b. a first summing point having a pair of inputs, one of the first summing point inputs coupled to the output of said control voltage waveform generator;
   c. a second summing point having a pair of inputs, one of the second summing point inputs coupled to the output of said first summing point;
   d. a voltage controlled oscillator coupled to the output of said second summing point;
   e. an error measurement subsystem coupled to the output of said voltage controlled oscillator, said error measurement subsystem having an output coupled to the other of the second summing point inputs and providing an analog servo error signal thereto;
   f. an adaptive correction system coupled to the output of said error measurement subsystem and coupled to the other of the first summing point inputs to provide an adaptive correction signal thereto, said adaptive correction system comprising:
      (i) first converting means for sampling said servo error signal and converting each servo error signal sample into digital form;
      (ii) exponential filter means coupled to said first converting means for computing an adaptive correction signal sample corresponding to a respective servo error signal sample, the collection of said adaptive correction signal samples forming said adaptive correction signal; and
      (iii) second converting means coupled to said exponential filter means for converting each adaptive correction signal sample into analog form and outputting the adaptive correction signal to said first summing point;
      (iv) control logic means coupled to said first and second converting means and said exponential filter means for initiating the sampling and conversion of said analog servo error signal in said first converting means, for initiating the conversion and outputting of each adaptive correction signal from said second converting means, and for controlling the computation of each adaptive correction signal sample in said exponential filter means; and
   g. a reference clock coupled to said error measurement system and said adaptive correction system.

16. The adaptive linear FM sweep generator of claim 15 further comprising:
   a first filter coupled between the output of said second summing point and the input of said voltage controlled oscillator; and
   a second filter coupled between the output of said adaptive correction system and said other input of said second summing point.

17. The adaptive linear FM sweep generator of claim 16 wherein said error measurement subsystem detects the frequency errors in the output signal from said voltage controlled oscillator and provides a corresponding servo error signal to correct the frequency errors in said output signal.

18. The adaptive linear FM sweep generator of claim 16 wherein said error measurement subsystem detects the phase errors in the output signal from said voltage controlled oscillator and provides a corresponding servo error signal to correct the phase errors in said output signal.

19. The adaptive linear FM sweep generator of claim 15 wherein said first converting means is an analog to digital converter and said second converting means is a digital to analog converter.

20. The adaptive linear FM sweep generator of claim 15 wherein said exponential filter means comprises:
   a subtractor having a pair of inputs, one of the subtractor inputs is coupled to the output of said first converting means;
   a data adder having a pair of inputs and an output, one of the data adder inputs coupled to the output of said subtractor; and
   a data memory having a data input port and a data output port, said data input port coupled to the output of said data adder, said data output port coupled to the other of the data adder inputs, the other of the subtractor inputs, and said second converting means.

21. The adaptive linear FM sweep generator of claim 20 further comprising memory addressing means coupled to said exponential filter and said control logic means, said memory addressing means comprising:
   an address counter;
   an address adder having a pair of inputs, one of the address adder inputs coupled to the output of said address counter;
   an address offset switch having an output coupled to the other of the address adder inputs; and
   an address multiplexer having a pair of inputs respectively coupled to the outputs of said address counter and said address adder, said address multiplexer having an output coupled to an addressing input of said data memory.

22. The adaptive linear FM sweep generator of claim 21 wherein said exponential filter further comprises a first data latch coupled between the output of said data adder and said data memory input port.

23. The adaptive linear FM sweep generator of claim 22 further comprising a second data latch coupled between said data memory output port and said second converting means.

24. The adaptive linear FM sweep generator of claim 21 further comprising memory select means, cooperating with said data memory and said memory addressing means for selectively addressing different blocks of memory within said data memory.

25. A method of correcting linearity errors in a series of output waveforms each linearly swept in frequency which comprises:
   generating a series of control signals;
   applying each of said control signals to a variable frequency oscillator;
   generating in said oscillator in response to each one of said applied control signals a corresponding output waveform linearly swept in frequency;
   measuring the linearity error in each one of said output waveforms;
   generating a plurality of first correction signals each corresponding to a respective one of said output waveforms, each of said first correction signals indicative of the linearity error occurring in said respective one of said output waveforms;
   applying each of said first correction signals to said oscillator so as to modify a corresponding control signal applied to said oscillator;

measuring the correlations between a present one of said first correction signals to previous ones of said first correction signals;

generating a plurality of second correction signals each corresponding to a present one of said first correction signals, each of said second correction signals indicative of the correlated linearity errors in a present one of said output waveforms to previous ones of said output waveforms;

applying a previous one of said second correction signals to said oscillator so as to modify a present one of said control signals applied to said oscillator such that a present one of said first correction signals and a previous one of said second correction signals respectively correct the uncorrelated and correlated linearity errors in a present one of said output waveforms.

26. The method of claim 25 wherein applying of said control signal to said oscillator, applying of said first correction signals to said oscillator, and applying said second correction signals to said oscillator comprises:

applying each one of said first correction signals in a predetermined sequence to a first summing point;

applying each one of said second correction signals in a predetermined sequence to a second summing point;

applying each one of said control signals to said second summing point;

summing said one of said control signals and a predetermined one of said second correction signals in said second summing point, the resulting signal being a first summation signal;

applying said first summation signal to said first summing point;

summing said first summation signal and a predetermined one of said first correction signals in said first summing point, the resulting signal being a second summation signal; and applying said second summation signal to said oscillator.

* * * * *